United States Patent [19]

Sasaki et al.

[11] Patent Number: 4,641,285
[45] Date of Patent: Feb. 3, 1987

[54] LINE CHANGE-OVER CIRCUIT AND SEMICONDUCTOR MEMORY USING THE SAME

[75] Inventors: Yukio Sasaki, Kokubunji; Kotaro Nishimura, Kodaira; Osamu Minato, Tokyo, all of Japan

[73] Assignee: Hitachi, Ltd., Tokyo, Japan

[21] Appl. No.: 640,508

[22] Filed: Aug. 13, 1984

[30] Foreign Application Priority Data

Oct. 26, 1983 [JP] Japan ................. 58/199022

[51] Int. Cl.[4] ............................. G11C 11/40
[52] U.S. Cl. ................. 365/210; 365/200; 365/189; 307/468; 371/10
[58] Field of Search ........... 365/200, 210, 174, 365/189, 96; 307/465, 468, 469; 371/10

[56] References Cited

U.S. PATENT DOCUMENTS 4,434,479 2/1984 Chen et al. .................. 365/210

Primary Examiner—Terrell W. Fears
Attorney, Agent, or Firm—Antonelli, Terry & Wands

[57] ABSTRACT

The line change-over circuit suitable for the semiconductor memory having a redundancy memory column comprises a pair of transfer gate elements provided between a first node to which a first signal to be transmitted is supplied and a pair of transmission lines, first and second switch elements. The paired transfer gate elements are controlled on a switch in complementary manner each other according to a transfer signal. The first switch element is controlled on a switch according to the transfer signal, and the second switch element is controlled on a switch according to the first signal transmitted to one of the paired transmission lines. The first switch element turns one of the transmission lines to a fixed potential like ground potential when it is kept on, and the second switch element turns the other of the transmission lines to a fixed potential when it is kept on. The line change-over circuit in the above configuration is effective to prevent a floating state of the paired transmission lines.

16 Claims, 4 Drawing Figures

LINE CHANGE-OVER CIRCUIT AND SEMICONDUCTOR MEMORY USING THE SAME

BACKGROUND OF THE INVENTION

This invention relates to a line change-over technique or that which is effective for application on a semiconductor integrated circuit and to a semi-conductor memory using the same thereon.

In a semiconductor memory like RAM (Random Access Memory), a deterioration of product yield due to an occurrence of defective bits becomes a subject of discussion in accordance with increase of a memory array capacity. In view of the situation above, it has been proposed that a redundancy circuit for relieving the defective bits by replacing a column or a row including defective bits in the memory array with a spare memory column or memory row prepared separately is provided, thereby improving the yield.

We, the inventors, have thought out the circuit shown in FIG. 1 as a line change-over circuit for changing a line of such redundancy circuit and a normal line. That is to say, the line change-over circuit comprises, for example, a programmable state setting means or a state setting circuit 1 constituted of a fuse element F and a resistance R connected in series between a supply voltage $V_{cc}$ and a ground potential of the circuit as illustrated. A level of a program signal S outputted from the state setting means 1 is determined according to whetehr or not the fuse element F is fused. A pair of N-channel type and P-channel type MOSFET's $Q_1$, $Q_2$ kept on or off in a complementary manner each other by the program signal S constitute a transfer gate for transmitting a selection signal $\phi_y$ of a Y decoder 2 selectively. In this configuration, when there is a defective bit present in a memory array (not illustrated), a program of the state setting means 1 is executed. That is, the fuse F of the state setting circuit 1 of state setting means 1 provided at every memory columns which corresponds to the memory column including the defective bit is fused. The MOSFET's $Q_1$ and $Q_2$ are turned off and on respectively according to the output level (program signal S) of the programmed state setting means 1. The selection signal $\phi_y$ outputted from the Y decoder 2 for MOSFET's $Q_1$ and $Q_2$ being turned off and on respectively is transmitted to a redundancy column switch for selecting a spare redundancy memory column through a line SL instead of being transmitted to a column switch (not illustrated) for connecting a data line of a normal memory column including the defective bit to a common data line. Consequently, the redundancy memory column is selected instead of the normal memory column including the defective bit.

According to this configuration, however, a line (wiring) of which side is cutted off by the program signal S of the state setting means 1 is kept floating. More specifically, in case the state setting means 1 is programmed so as to keep the N-channel type MOSFET $Q_1$ off and the P-channel type MOSFET $Q_2$ on, for example, for changing the memory column including the defective bit with a spare redundancy memory column in FIG. 1, a node A is kept floating by having MOSFET $Q_1$ cut off. In this case, an undesirable coupling which is brought with a stray capacitor between a wiring coupled to the node A and other wiring such as power wiring or the like cannot be neglected. If a potential at the node A kept floating is boosted instantaneously by coupling with a power supply, then a malfunction whereby a column switch of the memory column including a defective bit will be turned on is easy to take place.

The inventors have then thought out that resistors $R_1$, $R_2$ of high resistance which are not to exert an influence on level of the pulsing signal $\phi_y$ may be interposed between the normal line and the spare line on redundancy side and the ground potential of the circuit respectively as shown in FIG. 1, thereby fixing the lines forcedly on the ground potential of the circuit when MOSFET $Q_1$ or $Q_2$ on the lines is cut off. However, it has been found that the connection of such high resistances $R_1$, $R_2$ is still not effective to prevent the voltage floating on each line which is so brought by noise arising from an instantaneous power fluctuation or the like. The inventors have thought out further that a switch MOSFET indicated by $Q_3$ in the drawing, namely MOSFET $Q_3$ which is kept on according to a programmed state at the state setting means 1 may be provided, and then the switch MOSFET $Q_3$ will be turned on to drop a level of the line forcedly down to the ground potential of the circuit. In such method, however, another state setting means for setting on/off state of the switch MOSFET $Q_3$ will have to be provided separately from the state setting means 1 for changing to the spare redundancy memory column. Be that as it may, a portion to program inevitably increases in accordance with an increase in number of the state setting means as mentioned, which may involve an inconvenience to cause a deterioration of the device yield from insecureness of the program (fuse element being fused or the like).

SUMMARY OF THE INVENTION

An object of this invention is to provide a line change-over technique less in malfunction or erroneous operation.

Another object of this invention is to provide a semiconductor memory which is free of erroneous operation.

Another object of this invention is to provide a semiconductor memory securing a high yield.

The above-mentioned and other objects and advantages of this invention will become apparent from the detailed description and accompanying drawings.

A typical one of the invention disclosed herein will be summarized as follows:

In a semiconductor memory with redundancy circuit, a pair of transfer gates to be kept on or off in a complementary manner according to a transfer signal are provided midway of a transmission line of a selection signal to a normal memory column (row) and also midway of a transmission line to a spare redundancy memory column (row). A switch operated on the transfer signal to fix a level of the line is provided on the normal transmission line, and another switch operated according to the level of the normal transmission line to fix a level of the line is provided on the redundancy side transmission line. The level of the line on a side where there is no signal transmitted is automatically fixed thereby at least at the time of memory selection. That is, the line is discharged by having the switch which is connected thereto turned on. The above object can thus be attained according to this configuration. An erroneous operation due to a floating of the line on the side where there is no signal transmitted can be prevented without providing a state setting means or the like for generating a control signal of the switch for discharging the transmission line separately from a generating source of the transfer signal. Yield of a memory chip can be enhanced in addition.

DESCRIPTION OF THE PREFERRED EMBODIMENT

Figure 4:
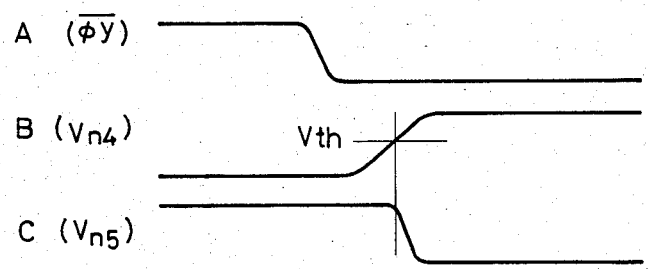
FIG. 4 is a timing chart showing a timing of signals at a retaining circuit.
Figure 2:
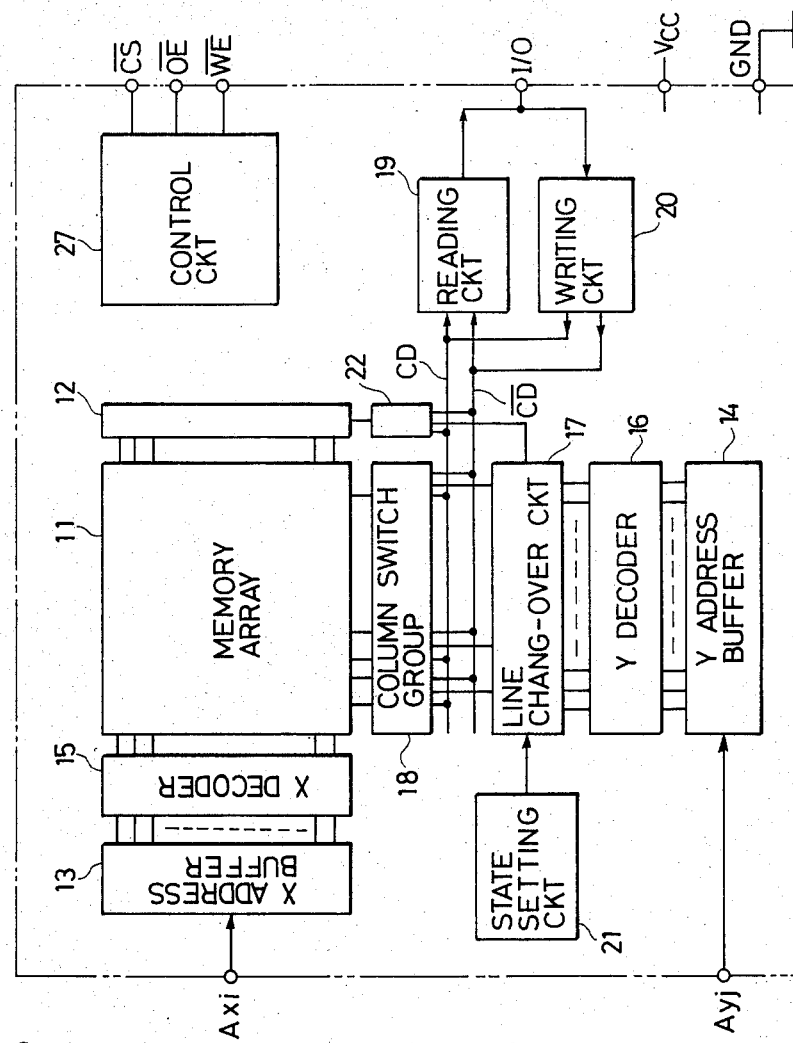
FIG. 2 is a block diagram showing one example of a static RAM given in one embodiment of this invention.
Figure 3:
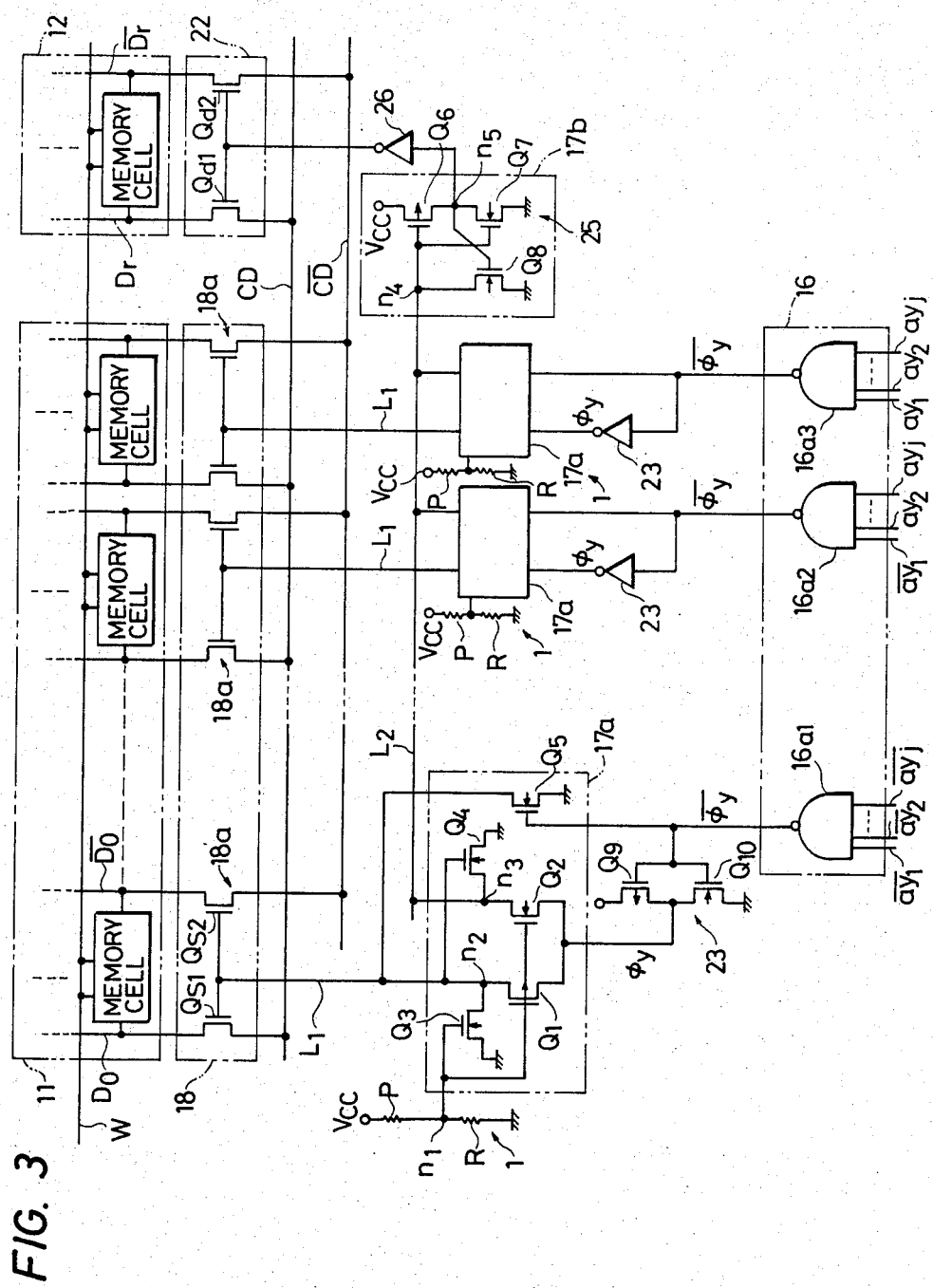
FIG. 3 is a circuit diagram showing one embodiment where the invention is applied to a change-over circuit of redundancy circuit of a memory.

FIG. 2 to FIG. 4 are a circuit block diagram, a circuit diagram and a timing chart respectively of one embodiment where this invention is applied to a CMOS static RAM.

First, a schematic configuration of a static RAM will be described with reference to the block diagram of FIG. 2. In RAM of FIG. 2, an arrangement is such that a memory column of a memory array 11 is selected by Y address, for example, and a memory column including a defective bit is replaced with a spare redundancy memory column 12 provided separately from the memory column 11.

Each circuit block surrounded by a two-dot chain line is formed on one semiconductor substrate according to a known CMOS Integrated circuit technique. A supply voltage is fed to RAM from a power unit (not illustrated) through a power terminal $V_{cc}$ and a ground terminal GND.

The memory 11 consists of a plurality of static memory cells in matrix layout, a plural pair of data lines and a plurality of word lines. Each static memory cell is constituted of a pair of N-channel MOSFET's with a gate and drain coupled crosswise and the sources maintained at a ground potential, a pair of load elements consisting of high resistance polysilicon layers which are provided between drains of such MOSFET's and the power terminal, and a pair of transmission gate MOSFET's provided between drains of such MOSFET's and data lines. Electrodes coupled to data lines of the transmission gate MOSFET's are regarded as data input/output terminals of the memory cells, and gates of the transmission gate MOSFET's are regarded as selection terminals of the memory cells. The selection terminals of the memory cells disposed in the same row are coupled to the word lines corresponding to the row. According to this configuration, one memory column is constituted of a pair of data lines and a plurality of memory cells coupled thereto. The redundancy memory column 12 is essentially the same in configuration as each memory column of the memory array 11. The selector terminal of each memory cell in the redundancy memory column 12 is coupled to the word line at the memory array 11. The redundancy memory column 12 can be regarded as constituting a part of the memory array 11.

An address signal $A_{xi}$ of X group and an address signal $A_{yj}$ of Y group which are supplied externally are inputted to X address buffer 13 and Y address buffer 14 respectively and converted into a proper level complying with the internal circuit. That is to say, internal address signals $a_{xi}$, $a_{yj}$ on a true level corresponding th the addresses $A_{xi}$, $A_{yj}$ and internal address signals $\overline{a_{xi}}$, $\overline{a_{yj}}$ on a false level are formed by the address buffers 13 and 14. Though the address signals $A_{xi}$, $A_{yj}$ are constituted of a plural bit address signal each, they are indicated as one signal each for simplicity in the drawing.

The internal address signals (internal complementary address signals) $a_{xi}$, $\overline{a_{xi}}$ are supplied to X decoder circuit 15 and are converted into signals for selecting the word line in the memory array 11 by the X decoder circuit 15. That is, one word line determined by the address signal $A_{xi}$ is made to a selector level. The internal address signals $a_{yj}$, $\overline{a_{yj}}$ are supplied to Y decoder circuit 16. A proper selection signal $\phi_y$ corresponding to the address signals $a_{yj}$, $\overline{a_{yj}}$ is formed by the Y decoder circuit 16. The selection signal $\phi_y$ is supplied to a column switch group 18 through a line change-over circuit 17. The column switch group 18 comprises column switches provided between a plurality of paired data lines of the memory column in the memory array 11 and common data lines CD, $\overline{CD}$. When the selection signal $\phi_y$ is supplied to the column switch group 18, one of paired complementary data line corresponding to the address signals are coupled to common data lines CD and $\overline{CD}$. Data of the selected memory cell, namely the memory cell connected to the selected word line and also to the selected complementary data line is sent to a reading circuit 19 through the common data lines CD, $\overline{CD}$, amplified and then read out through input/output terminal (herinafter called I/O terminal). Or a write data supplied to the I/O terminal is written in the selected memory cell through a writing circuit 20 and the common data lines CD, $\overline{CD}$. Both the reading circuit 19 and the writing circuit 20 are controlled for operation by a control circuit 27 which receives an external control signal through a chip selector terminal $\overline{CS}$, an output enable terminal $\overline{OE}$ and a write enable terminal $\overline{WE}$. A configuration and operation of the control circuit 27 and the reading circuit 19 and the writing circuit 20 controlled thereby can be made same as those of a known static RAM, and hence no further description will be given here.

While indicated as a single circuit in FIG. 2, a state setting circuit 21 is constituted of a plurality of unit circuits made corresponding one-to-one to each memory column. A change-over state of the line change-over circuit 17 is determined by a signal outputted from the setting circuit 21. Where there exists a memory column including defective bit, the program of a program element at the state setting circuit corresponding to the memory column is executed. Thus a state in the line change-over circuit 17 is changed. Where the selection signal $\phi_y$ for selecting the memory column including defective bit is outputted from Y decoder circuit 16, the signal $\phi_y$ is supplied to a redundancy column switch 22 provided in the spare redundancy memory column 12 instead of to the normal column switch 18 by the line change-over circuit 17 to turn it on. A complementary data line of the redundancy memory column 12 is connected to the common data lines CD, $\overline{CD}$ consequently instead of the normal memory column including defective bit, and thus a data is read to or written in the memory cell belonging to the redundancy memory column 12.

One preferred embodiment of the above-mentioned line change-over circuit 17 is illustrated in detail in FIG. 3.

Not particularly limited thereto, but a main circuit in the drawing is drawn in accordance with an actual layout on the semiconductor substrate. However, the following each unit change-over circuit, state setting means and retaining circuit are drawn somewhat larger for easy observation of the drawing.

Not so particularly limited, but each state setting circuit 1 provided correspondingly one-to-one to the normal memory column comprises, for example, a program element P consisting of a high resistance polysilicon element and the like which is made low in resistance through laser annealing and a resistance element R. The transfer signal outputted from the state setting circuit 1 is made low in level near to the ground potential GND of the circuit if a resistance value of the program element P is left high, but is made high in level near to the supply potential $V_{cc}$ if the resistance value of the program element P is kept low.

The line change-over circuit 17 is constituted of a plurality of unit change-over circuits 17a provided correspondingly one-to-one to each memory column in the memory array 11 and a retaining circuit 17b determining and so holding a state of the redundancy column switch 22. The retaining circuit 17b and each unit change-over circuit 17a are connected through one common redundancy transmission line $L_2$. When each one unit change-over circuit 17a is made to select the redundancy memory column, a selection signal $\overline{\phi_y}$ (the inversion signal in this embodiment) outputted from Y decoder circuit 16 is supplied to the retaining circuit 17b through the common transmission line $L_2$. The redundancy column switch 22 is thus actuated.

The transfer signal outputted from the state setting means 1, the selection signal $\overline{\phi_y}$ outputted from Y decoder circuit 16, and the inversion signal $\phi_y$ outputted from an inverter 23 consisting of a P-channel MOSFET $Q_9$ and an N-channel MOSFET $Q_{10}$ are supplied to each unit change-over circuit 17a, which will be described each hereinlater.

Each unit change-over circuit 17a has an output node or line coupled to a normal transmission line $L_1$ made to correspond to the normal memory column and another output node or line coupled to the common transmission line $L_2$ made to correspond to the spare redundancy memory column.

Lines linked with the normal transmission line $L_1$ and the common transmission line $L_2$ on redundancy side are provided each with the P-channel type MOSFET $Q_1$ and the N-channel type MOSFET $Q_2$ constituting transfer gates kept open or close each other in complementary manner on a set potential (transfer signal) of the state setting cirucit 1.

Further, a switch MOSFET $Q_3$ of which on or off state is controlled by the set potential of the state setting cirucit 1 is provided between the line linked with the normal transmission line $L_1$ and a ground point of the circuit, and another switch MOSFET $Q_4$ turned on or off according to a potential of the normal transmission line $L_1$ is provided between the line linked with the common transmission line $L_2$ and the ground point of the circuit. Not particularly so limited, however, the switch MOSFET $Q_3$ is arranged in N-channel type and that MOSFET $Q_1$ is arranged in P-channel type in this embodiment so as to hold MOSFET $Q_3$ on when MOSFET $Q_1$ working as a transfer gate is cut off on a set potential at the state setting circuit 1. Then, MOSFET $Q_4$ as a switch is arranged in N-channel type so as to come to an on-state when a potential of the transmission line $L_1$ is kept at high level.

A switch MOSFET $Q_5$ operated on the selection signal $\overline{\phi_y}$ outputted from a unit decoder 16a is provided between the normal transmission line $L_1$ and the ground point of the circuit. The reason why the switch MOSFET $Q_5$ is provided is that a potential fluctuation regarded as a noise is given to the transmission line $L_1$ through an undesirable parasitic capacity (not illustrated) present between the transmission line and other signal line. Where the transmission line $L_1$ is essentially kept floating, a level of the undesirable potential fluctuation given to the transmission line $L_1$ cannot be suppressed essentially. When a potential of the transmission line kept corresponding to a memory column to be placed nonselectively rises undesirably on noise, the memory column will be selected erroneously. The switch MOSFET $Q_5$ is therefore provided. A transmission line $L_1$ to be kept at a nonselective level is forced to a ground potential of the circuit when MOSFET $Q_5$ is kept on.

The switch MOSFET $Q_5$ is arranged in a channel conductive type ready for on-state when the selection signal $\overline{\phi_y}$ is kept at a nonselective level (high level in the embodiment). Thus the MOSFET $Q_5$ is arranged in an N-channel type.

In the embodiment where the normal memory column including a defective bit is to be replaced by the spare redundancy memory column, the program element P in the state setting circuit 1 corresponding to the memory column including the defective bit is made low in resistance by laser annealing. That is, the program is executed. As a result of program execution, the potential of a node $n_1$ is turned to a high level potential which is so obtainable through dividing the supply voltage $V_{cc}$ by a resistance ratio of the program element P kept low in resistance to the resistance R.

According to this embodiment, a circuit operation when the redundancy memory column is selected and a circuit operation when the memory column excluding a defective bit are as follows:

An output potential of the state setting circuit 1 corresponding to the normal memory column including a defective bit is made high in level as described according to an execution of the program beforehand. MOSFET $Q_1$ as a transfer gate is cut off accodingly, and that $Q_2$ is kept on. Thus, output signal $\phi_y$ of the inverter 23 for inverting the selection signal $\overline{\phi_y}$ supplied from the unit decoder 16a is sent to the retaining circuit 17b by way not of the normal transmission line $L_1$ but of the on-state MOSFET $Q_2$ and the common transmission line $L_2$. That is to say, when output signal $\overline{\phi_y}$ of the Y decoder circuit 16 is made to a selective level (low level) as shown in FIG. 4 A, the common transmission line $L_2$ is made to a selective level (high level) accordingly as shown in FIG. 4 B. When the common transmission line $L_2$ is made to a selective level, an output of the retaining circuit 17b is made to a low level accordingly as shown in FIG. 4 C, and an output of the inverter 26 is made to a high level. N-channel MOSFET's $Q_{d1}$ and $Q_{d2}$ constituting the column switch 22 are kept on since the output of the inverter 26 is made to a high level. The redundancy memory column 12 is selected consequently.

In this case, the switch MOSFET $Q_3$ made corresponding to the programmed state setting circuit 1 is kept on according to a set potential (high level) of the state setting circuit 1. Consequently, an output node $n_2$ and the transmission line $L_1$ coupled to the node $n_2$ are discharged through MOSFET $Q_3$ regardless of the on and off state of MOSFET $Q_5$. Thus the transmission line $L_1$ is brought down forcedly to a ground level of the circuit and hence is prevented from coming to a floating state. Further in this case, since the switch MOSFET $Q_4$ is kept off by a low level potential at the transmission line $L_1$ fixed at a ground level (ground potential of the circuit), no influence will be exerted on the signal level transmitted to the common transmission line $L_2$.

On the other hand, in FIG. 3, where a program to the program element P in the state setting means 1 has not been executed as the memory column kept selective on the selection signal $\overline{\phi}_y$ sent through the normal transmission line $L_1$ has not a defective bit, a potential of the node $n_1$ is made to a low level as the program element P has a high resistance value. Thus the MOSFET $Q_1$ as the transfer gate is kept on and that $Q_2$ is kept off. The output signal $\phi_y$ of the inverter 23 is sent to a column switch 18a through the MOSFET $Q_1$ and the normal transmission line $L_1$, consequently. When the output selection signal $\overline{\phi}_y$ of Y decoder circuit 16 is made to a selective level (low level), the output signal $\phi_y$ of the inverter 23 is made to a selective level (high level). The normal transmission line $L_1$ is made to a selective level (high level), accordingly. N-channel MOSFET's $Q_{s1}$ and $Q_{s2}$ constituting the column switch 18a are kept on in accordance with the transmission line $L_1$ is made to a selectgve level. The normal memory column is selected, consequently.

In this case, since the MOSFET $Q_3$ is kept off by the set potential (low level) of the state setting means 1, no influence will be exerted on the signal level supplied to the transmission line $L_1$. The MOSFET $Q_5$ is kept off when the output signal $\overline{\phi}_y$ of Y decoder circuit 16 is made to a selective level (low level). Therefore, MOSFET $Q_5$ will exert no influence on the signal of selective level which is supplied to the transmission line $L_1$.

When a selection of the transmission line $L_1$ is started, the MOSFET $Q_4$ connected between a node $n_3$ and a ground point of the circuit is turned on accordingly. From the MOSFET $Q_4$ being on, the common transmission line $L_2$ coupled to the node $n_3$ is forced to a ground potential (low level) of the circuit. Thus, a noise given to the common transmission line $L_2$ through parasitic capacitors (not illustrated) present among the common transmission line $L_2$ and other signal line and power line has its level satisfactorily minimized. In other words, a state in which the common transmission line $L_2$ is kept essentially floating can be prevented by the MOSFET $Q_4$. Incidentally, the common transmission line $L_2$ is also forced to a ground potential by the MOSFET $Q_8$ in the retaining circuit 17b. However, as will be apparent from the description given later, the MOSFET $Q_8$ needs to have a relatively high on-resistance. Therefore, the MOSFET $Q_8$ is not so powerful in forced driving ability. Further, in case one of the line change-over circuits 17a is controlled for selecting the redundancy memory column, the common transmission line $L_2$ is forced to a ground potential, as will be apparent from the description given later, through the MOSFET $Q_2$ in one line change-over circuit and MOSFET $Q_{10}$ in the inverter circuit 23. However, in case all the line change-over circuits 17a are controlled for selecting normal memory column, or there is no defective bit present in any memory columns of the memory array 11, any current path through the MOSFET's $Q_2$ and $Q_{10}$ is not constituted.

Therefore, a grounding ability by the MOSFET $Q_4$ will particularly be significant where there is no defective bit present in the memory array 11.

Incidentally, the selection signal $\overline{\phi}_y$ of high level is supplied to each unit change-over circuit kept corresponding to the remaining memory columns. Consequently, since MOSFET $Q_5$ in each unit change-over circuit is kept on, each transmission line $L_1$ kept corresponding to each nonselective memory column is forced to a ground potential of the circuit. Accordingly, the memory column to be in nonselective state can be prevented from being selected undesirably.

The node $n_3$ in the unit change-over circuit 17a same in configuration as the above which is provided correspondingly to each memory column is connected to the common transmission line $L_2$ on redundancy side. According to this embodiment, only one of the state setting circuit 1 corresponding to the memory column including a defective bit is programmed.

Not particularly so limited, but in this embodiment, the retaining circuit 17b is provided in one end of the common transmission line $L_2$.

The retaining circuit 17b is constituted of a CMOS inverter 25 consisting of P-channel MOSFET $Q_6$ and N-channel MOSFET $Q_7$ having each gate terminal connected to a terminal node $n_4$ of the common transmission line $L_2$ and MOSFET $Q_8$ connected between the node $n_4$ and the ground point of the circuit and having its gate connected to an output node $n_5$ of the inverter 25. Accordingly, the retaining circuit 17b is constituted of a flip-flot circuit.

The one MOSFET $Q_8$ constituting the flip-flot circuit is designed so that its on-resistance will be increased as compared with on-resistance of MOSFET $Q_9$ constituting the inverter 23 and MOSFET $Q_2$ constituting the transfer gate by having the element size (W/L ratio; W being channel width, L being channel length) made comparatively small. Thus, a divided voltage appearing on the common transmission line $L_2$ when the MOSFET's $Q_9$, $Q_2$ and $Q_8$ are all kept on becomes larger than a logic threshold voltage of the inverter 25.

An operation of the retaining circuit 17b will be stabilized normally in the state where the node n becomes low in level. That is to say, the retaining circuit 17b has a stable state or reset state made corresponding to the time when the node $n_4$ is kept at a low level and a metastable state of set state made corresponding to the time when the node $n_4$ is kept at a high level. The stable state of the retaining circuit 17b signifies non-selection of the redundancy memory column, and the metastable state signifies selection of the redundancy memory column.

The operation of the retaining circuit 17b is stabilized automatically so as to make the redundancy memory column nonselective at the time of power starting.

Immediately after the power starting, the node $n_4$ and the common transmission line $L_2$ coupled to the node $n_4$ are kept at a low level approximate to a ground potential of the circuit in accordance with parasitic capacitors (not illustrated) which are coupled thereto. Since the node $n_4$ is kept at low level, a level at the output node $n_5$ of the inverter 25 rises when the supply voltage $V_{cc}$ is stepped up. The MOSFET $Q_8$ is kept off at first but is turned on strongly when the level of the output node $n_5$ rises. The node $n_4$ is forced to a low level in consequence of the MOSFET $Q_8$ being turned on. Thus, the operation state of the retaining circuit 17b becomes to the stable state.

After the power starting, where the selection signal $\phi_y$ is supplied to the common transmission line $L_2$ through the transfer gate $Q_2$ in the change-over circuit 17a, the operation state of the retaining circuit 17b is inverted as described below.

When the selection signal $\overline{\phi_y}$ is made to a low level, the MOSFET $Q_9$ in the change-over circuit 17a is kept on accordingly. A current path constructed by the MOSFET's $Q_9$, $Q_2$ and $Q_8$ will be formed consequently. In this case, an arrangement is such that an on-resistance of the MOSFET $Q_8$ will become larger than that of MOSFET's $Q_9$ and $Q_2$, as described hereinbefore, therefore a potential of the node $n_4$ is stepped up toward a voltage higher than the logic threshold voltage of the inverter 25. When the potential of the node $n_4$ becomes higher than the logic threshold voltage Vth of the inverter 25, a potential $V_{n5}$ of the node $n_5$ is made to a low level. Since MOSFET $Q_8$ is cut off by the low level of the node $n_5$, the above-mentioned current path is cut off. Thus, the operation of the retaining circuit 17b comes to a metastable state wherein the node $n_4$ is kept at a level approximate to the supply voltage Vcc level. As described above, the redundancy memory column is selected by an inversion of the state of the retaining circuit 17b.

When an output (selection signal $\overline{\phi_y}$) of the unit decoder 16a in Y decoder circuit 16 is changed from low level to high level, the operation of the retaining circuit 17b is returned to stable state. That is, in the nonselective state, the MOSFET $Q_{10}$ in the inverter 23 is turned on. A potential of the node $n_4$ deteriorates accordingly thereto from having the charge given to the node $n_4$ extracted through MOSFET's $Q_2$ and $Q_{10}$. When the potential of the node $n_4$ is deteriorated, a state of the retaining circuit 17b constituting a flip-flop circuit is inverted. That is, the node $n_5$ is reset to a high level. Then the redundancy column switch 22 is turned off thereby.

As described above, when the normal transmission line $L_1$ is made to a high level and the switch MOSFET $Q_4$ is turned on, the node $n_4$ is fixed to a low level accordingly. If the node $n_4$ is kept floating when the normal memory column is selected, a potential of the node $n_4$ is capable of floating according to a coupling between the node $n_4$ and the power supply. In such case, the redundancy memory column will be selected erroneously by the floating potential of the node $n_4$. The MOSFET $Q_4$ prevents such floating of the potential of the node $n_4$. Consequently, there may occur no such state wherein the normal memory column and the redundancy memory column are selected simultaneously.

In the above embodiment, the retaining circuit 17b is constituted of a flip-flop consisting of the three MOSFET's $Q_6$ to $Q_8$. However, the configuration of the retaining circuit 17b can be changed. For example, the retaining circuit 17b can be constituted of a flip-flop in normal four-element configuration which comprises adding P-channel type MOSFET for which a potential of the output node $n_5$ of the inverter 25 is received on the gate between the node $n_4$ and the supply voltage Vcc. In such case, however, it is necessary to set a constant of elements constituting the circuit beforehand so as to stabilize a potential of the output node $n_5$ of the inverter 25 at a high level at the time of power starting.

Furthermore, the retaining circuit 17b is not always required. A circuit of the following configuration may be employed instead of the retaining circuit 17b. That is, an additional switch MOSFET operated on the selection signal $\overline{\phi_y}$ from the unit decoder or its inversion signal $\phi_y$ can be provided between the common transmission line $L_2$ and a ground potential point of the circuit at each unit change-over circuit 17a. In this case, the additional switch MOSFET is turned on at the time of nonselection of the memory wherein the selection signal $\overline{\phi_y}$ is made to a high level. Thus a level of the common transmission line $L_2$ is fixed on the ground. An erroneous operation of the redundancy memory column which is capable of arising where the common transmission line $L_2$ is kept floating can be prevented accordingly.

However, an arrangement wherein the retaining circuit 17b is provided in one only on a terminal of the common transmission line $L_2$ as in the case of above embodiment may be advantageous on layout to keep the wiring and circuit elements less required than in the case where the switch MOSFET is provided at each changeover circuit 17a.

Then in the above embodiment, the MOSFET $Q_1$ constituting a transfer gate is made to a P-channel type, and the MOSFET $Q_2$ is made to an N-channel type, however, the configuration may be reversed, needless to say. Further, the switch MOSFET's $Q_3$ to $Q_5$ provided for discharging each transmission line at the time of nonselection are made to N-channel type, however, these are not necessarily limited thereto but can be made to P-channel type.

In the embodiment, furthermore, a level of the normal transmission line $L_1$ is fixed on the ground at the time of nonselection of the memory, and in addition the switch MOSFET $Q_5$ is provided for preventing such transmission line $L_1$ from floating. However, an appreciable malfunction can be prevented by arranging such that at least an erroneous memory column will not be selected at the time of memory selection. Therefore, the MOSFET $Q_5$ is not necessarily to be provided and hence is omissible. Furthermore in the embodiment, there is provided the inverter 23 for inverting the output (selection signal $\overline{\phi_y}$) of Y decoder 16, and an output of the inverter 23 is transferred to the column switch 18a. However, instead of providing the inverter 23, the output of Y decoder 16 can be transferred to the column switch 18a through the transfer gate. Further, a 1- or 2-stage inverter can be connected between a terminal of the normal transmission line $L_1$ and each column switch, and thus the column switch 18a will be operated by the inverter.

Figure 1:
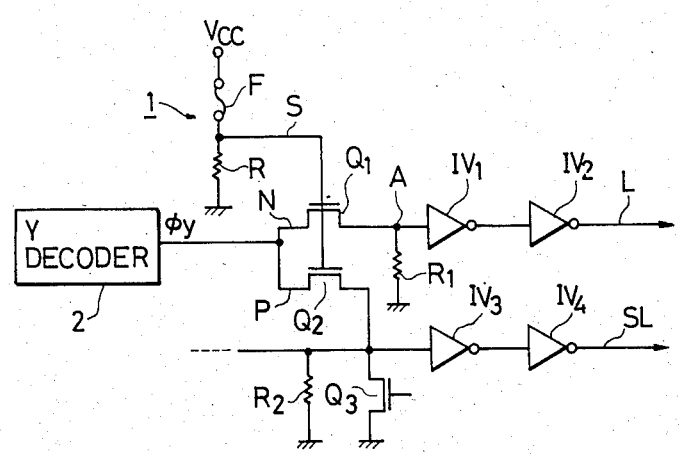
FIG. 1 is a circuit diagram showing one example of a change-over circuit of redundancy circuit at a static RAM conceived by the inventors.

Furthermore, in the above embodiment, a resistance element capable of being lowered in resistance through laser annealing is employed as a program element in the state setting circuit 1. However, the program element can be constituted of a fuse element fusible on laser or electric current as in the case of FIG. 1.

Then, on the contrary to the above-described embodiment, a MOSFET $Q_3$ for fixing a line potential according to a transfer signal of the state setting circuit can be provided between the common line $L_2$ and the ground potential point of the circuit, and also a MOSFET $Q_4$ with its gate coupled to the common transmission line can be provided between the line $L_1$ and the ground potential point of the circuit. In this case, for example, the MOSFET $Q_3$ is made to a P-channel type and the MOSFET $Q_4$ is made to an N-channel type.

In the embodiment, furthermore, the invention is applied to the static RAM in CMOS configuration, however, this invention is not limited to the static RAM or the memory in CMOS configuration.

Further, in the above embodiment, the memory column is constituted of a plurality of memory cells with the input/output terminals coupled to the same complementary data lines $D_o$, $\overline{D}_o$, and the redundancy memory column is constituted of a plurality of memory cells with the input/output terminals coupled to the complementary data lines $D_r$, $\overline{D}_r$. However, each one memory cell only is shown in FIG. 3 for simplification. Further, the memory row is constituted of a plurality of memory cells with the selector terminals coupled to the same word line W. For simplification, only one memory row is shown likewise in FIG. 3.

The description has been given above with reference to the column switch 18a which is constituted of N-channel type MOSFET's $Q_{s1}$, $Q_{s2}$, however, it can be constituted of P-channel type MOSFET's, otherwise.

Effects (1) The line change-over circuit comprises first and second transfer gates for switching operation in complementary manner on a transfer signal, a first output terminal to which a signal is supplied through the first transfer gate, a second output terminal to which the above signal is supplied through the second transfer gate, a first switch element controlled on the transfer signal and operating for impressing a predetermined potential on the first output terminal when the signal is supplied to the second output terminal through the second transfer gate, a second switch element for impressing a predetermined potential on the second output terminal accordingly when the signal transferred to the first output terminal through the first transfer gate is predetermined signal. Thus, when the signal is transferred to the second output terminal through the second transfer gate, the potential of the first output terminal is fixed to a predetermined value, and when the predetermined signal is transferred to the first output terminal through the first transfer gate, the potential of the second output terminal is fixed to a predetermined value. Consequently, if an undesirable noise or the like is transferred to the first output terminal when a signal is transferred to the second output terminal, or if a noise or the like is transferred to the second output terminal when a desirable signal is transferred to the first output terminal, a change in potential on the first output terminal due to the noise or a change in potential on the second output terminal can be prevented. That is, if a noise or the like is transferred, then a potential of the terminal from which no signal is outputted can be prevented from fluctuating, thus ensuring a correct signal to output effectively.

(2) A pair of transfer gates kept open or close in complementary manner on a transfer signal from a state setting means or the like are provided on the transmission line of selection signals to a normal memory column and also on the transmission line of selection signals to a spare redundancy memory column, a switch operated on the transfer signal and capable of fixing a level of the one (on normal or redundancy side) transmission line is provided thereon, and a switch operated according to a level of the normal (or redundancy side) transmission line and capable of fixing a level of the redundancy (or normal) transmission line is provided on the other (redundancy side or normal) transmission line. Thus, the normal (or redundancy side) transmission line is fixed for the level whenever the transfer gate is cut off on the transfer signal, the other redundancy (or normal) transmission line is fixed automatically for the level on the signal passing through the normal (or redundancy) transmission line whenever the transfer gate is cut off on the transfer signal, thereby preventing the line on a side where the signal is not transmitted from floating at the time of signal transfer and also preventing an erroneous operation of the memory consequently.

(3) A pair of transfer gates kept open or close in complementary manner nutually on a transfer signal from a state setting means or the like are provided on the transmission line of selection signals to the normal memory column and also on the transmission line of pulsing signals to the spare redundancy memory column, a switch operated on the transfer signal and capable of fixing a level of the one (normal or redundancy side) transmission line is provided thereon, and a switch operated according to a level of the normal (or redundancy side) transmission line and capable of fixing a level of the redundancy (or normal) transmission line is provided on the other (redundancy side or normal) transmission line. Thus, the normal (or redundancy side) transmission line is fixed for the level whenever the transfer gate is cut off on the transfer signal, the other redundancy (or normal) transmission line is fixed automatically for the level on the signal passing through the normal (or redundancy) transmission line whenever the transfer gate is cut off on the transfer signal, and thus a state setting means for setting a state of the switch for fixing a level of the line on cut-off side will not particularly be required separately from the state setting means for generating a signal for the transfer of transmission lines. Thus, a floating of the transmission line on a side where the signal is not transmitted can be prevented without increasing a program portion. Since a program low in reliability can be decreased thereby, a yield of the memory can be enhanced.

(4) Since a switch operated by a signal to be transmitted and capable of fixing a normal transmission line is provided on the transmission line, a level of the normal transmission line is fixed forcedly while the signal is not transmitted, therefore a floating of the normal transmission line when the signal is not transmitted as in the case of nonselection can be prevented, and a malfunction of the memory is prevented accordingly.

(5) The transmission line on redundancy side is used in common, and a retaining circuit for holding a level of the transmission line stably is provided on the common transmission line, therefore a level of the transmission line at the time of power starting is fixed to a predetermined level, and the level of the transmission line is reset automatically to an initial level state by the retaining circuit when the signal has been transmitted, thus a floating of the redundancy common transmission line is securely prevented, and a malfunction or an erroneous operation of the memory can be prevented accordingly.

(6) The unit change-over circuit and the retaining circuit can be constituted of MOSFET's comparatively few in number, and a program element will do in one piece only per unit change-over circuit, therefore the unit change-over circuit, the state setting means and the retaining circuit can be miniaturized. Thus the unit change-over circuit, the state setting means and the retaining circuit can be formed in line with a pitch (space) of the data line. An effect is obtainable such that the memory can be miniaturized thereby.

(7) MOSFET provided between a transmission line and a predetermined potential point for fixing a potential of the transmission line is turned off when a signal is transmitted through the transmission line, therefore a current is prevented from flowing through the MOSFET. Thus, a low power consumption can be realized on the memory.

The invention has been described concretely as above with reference to its preferred embodiment, however, the invention is not particularly limited to the specific embodiment thereof, and it is to be understood that various changes and modifications may be made without departing from the spirit and scope thereof.

For example, in the above embodiment, an arrangement is such that the normal memory column including a defective bit is replaced with a spare redundancy memory column through a change-over circuit, however, the memory row including a defective bit can be replaced with a spare memory row. Further, it is applicable to the case where a plurality of redundancy memory columns (rows) will be provided to transfer.

The above description has referred to the case where the invention made by teh inventors is applied chiefly to a transfer technique of the redundancy circuit in a static RAM which is the background applicable field, however, it is not necessarily limited thereto, but applicable to a general transfer technique of two transmission lines to say nothing of a semiconductor memory such as dynamic RAM, EPROM or the like.

What is claimed is:

1. A line change-over circuit, comprising:
a first node to which a first signal to be transmitted is supplied;
a first transfer gate provided between said first node and a second node and operating as a switch according to a transfer signal;
a second transfer gate provided between said first node and a third node and operating as a switch in a complementary manner to said first transfer gate according to said transfer signal;
a first switch element coupled to said second node and turning said second node to a first fixed potential when said first transfer gate is kept off, said first switch element being operated as a switch according to said transfer signal; and
a second switch element coupled to said third node and turning said third node to a second fixed potential when said first signal is supplied to said second node.

2. A line change-over circuit as defined in claim 1, wherein said first fixed potential and second fixed potential are equal with each other.

3. A line change-over circuit as defined in claim 2, wherein said second switch element coupled to said third node operates as a switch according to said first signal.

4. A line change-over circuit as defined in claim 2, further comprising a retaining circuit coupled to said third node and giving a positive feedback signal to said third node by referring to a signal level of said third node.

5. A line change-over circuit as defined in claim 1, wherein said first transfer gate is constituted of a first channel conductive insulating gate field effect transistor, and said second transfer gate, first and second switch elements are constituted each of a channel conductive insulating gate field effect transistor contrary to said first channel conductive one.

6. A semiconductor memory, comprising;
a first node to which a selection signal formed according to address signals is supplied;
a line change-over circuit provided between said first node and second and third nodes, which comprises a first transfer gate provided between said first node and second node and operated as a switch according to a transfer signal, a second transfer gate provided between said first node and third node and operated as a a switch in a complementary manner to said first transfer gate according to said transfer signal, a first switch element coupled to said second node and turning second node to a first fixed potential when said first transfer gate is kept off, and a second switch element coupled to said third node and turning said third node to a second fixed potential when said selection signal is supplied to said second node;
a plurality of first memory cells selected according to the selection signal supplied to said second node through said line change-over circuit; and
a plurality of second memory cells selected according to the selection signal supplied to said third node through said line change-over circuit.

7. A semiconductor memory as defined in claim 6, wherein said first and second fixed potentials are kept at a level of which said first and second memory cells are not selected respectively.

8. A semiconductor memory as defined in claim 7, said line change-over circuit wherein said second switch element coupled to said third node and turning said third node to the second fixed potential operated as a switch according to said selection signal.

9. A semiconductor memory as defined in claim 7, further comprising a retaining circuit coupled to said third node and giving a positive feedback signal to said third node by referring to a signal level of said third node.

10. A semiconductor memory as defined in claim 7, each said first and second memory cells comprising a static memory cell.

11. A semiconductor memory, comprising
a plurality of first nodes, each of which is supplied with a selection signal formed according to an address signal;
a plurality of second nodes corresponding respectively to said first nodes;
a third node;
a plurality of line change-over circuits respectively provided between the first nodes and the second nodes corresponding to each other, each of which line change-over circuits comprises a first transfer gate provided between the first node corresponding thereto and the second node and operating as a switch according to a transfer signal, a second transfer gate provided between the first node corresponding thereto and said third node and operating as a switch in a complementary manner to said first transfer gate according to said transfer signal, a first switch element coupled to said first node corresponding thereto and turning said second node to a first fixed potential when said first transfer gate is kept off, and a second switch element coupled to said third node and turning said third node to a second fixed potential when a selection signal is supplied to said second node corresponding thereto;
a plurality of first memory cells selected on said selection signal supplied to the second nodes; and
a plurality of second memory cells selected on said selection signal supplied to the third node.

12. A semiconductor memory as defined in claim 11, wherein said first and second memory cells are constituted each of a memory cell capable of writing and reading data.

13. A semiconductor memory as defined in claim 12, further comprising a plurality of state setting circuits provided one-to-one to each line change-over circuit, each state setting circuit including a program element for determining a level of the transfer signal to be outputted therefrom.

14. A semiconductor memory as defined in claim 13, said program element comprising a resistance element lowered in resistance by execution of a program.

15. A semiconductor memory as defined in claim 13, said program element comprising a fuse element.

16. A semiconductor memory as defined in claim 13, further comprising:
- a plurality of first data lines to which data input/output terminals of said first memory cells are coupled;
- a second data line to which data input/output terminals of said second memory cells are coupled;
- a common data line;
- a plurality of first column switches provided between said first data lines and said common data line and operating as a switch according to a selection signal supplied to the second nodes corresponding thereto; and
- a second column switch provided between said second data line and said common data line and operating as a switch according to a selection signal supplied to said third node.

* * * * *